United States Patent

Nakasuji

[11] Patent Number: 5,753,922
[45] Date of Patent: May 19, 1998

[54] ELECTROMAGNETIC DEFLECTOR

[75] Inventor: Mamoru Nakasuji, Yokohama, Japan

[73] Assignee: Nikon Corporation, Tokyo, Japan

[21] Appl. No.: 745,747

[22] Filed: Nov. 12, 1996

[30] Foreign Application Priority Data

Nov. 20, 1995 [JP] Japan .................. 7-301267

[51] Int. Cl.$^6$ ................................ H01J 49/20
[52] U.S. Cl. .................. 250/396 ML; 335/210
[58] Field of Search .............. 250/396 ML, 396 R, 250/492.2, 398, 310; 335/210, 211

[56] References Cited

U.S. PATENT DOCUMENTS 4,785,176 11/1988 Frosien et al. .............. 250/396 ML
5,264,706 11/1993 Oae et al. .................. 250/492.2

*Primary Examiner*—Kiet T. Nguyen
*Attorney, Agent, or Firm*—Klarquist Sparkman Campbell Leigh & Whinston, LLP

[57] ABSTRACT

Electromagnetic deflectors and methods for their manufacture are disclosed. The excitation coils inside such deflectors can be situated relative to each other and to an optical axis with a high degree of accuracy and precision. A pair of loop-shaped channels are formed opposite each other in the sides of a cylindrical insulating cylinder. An electrically conductive material is embedded in the channels to form a set of opposing coils operable to deflect a charged particle beam passing axially through the cylinder in one dimension. Multiple cylinders each comprising a set of opposing coils can be concentrically assembled to provide, e.g., a biaxial deflector operable to deflect the beam in an X-dimension and a Y-dimension. In such a biaxial deflector, the sets of coils are arranged perpendicular to each other. The cylinder(s) is placed concentrically inside a cylindrical outer casing made of a ferromagnetic material such as ferrite to make an electromagnetic deflector.

13 Claims, 2 Drawing Sheets

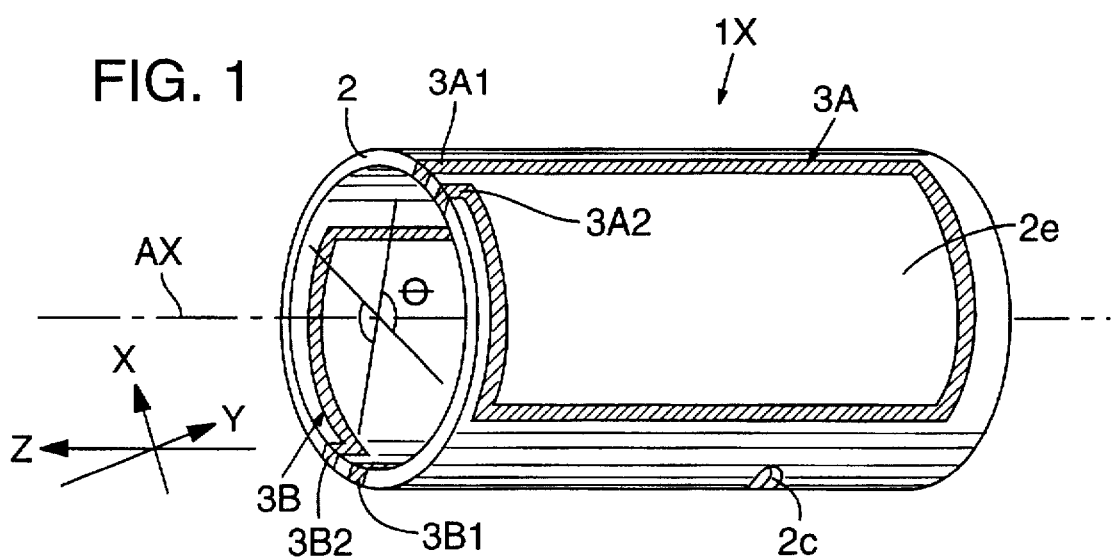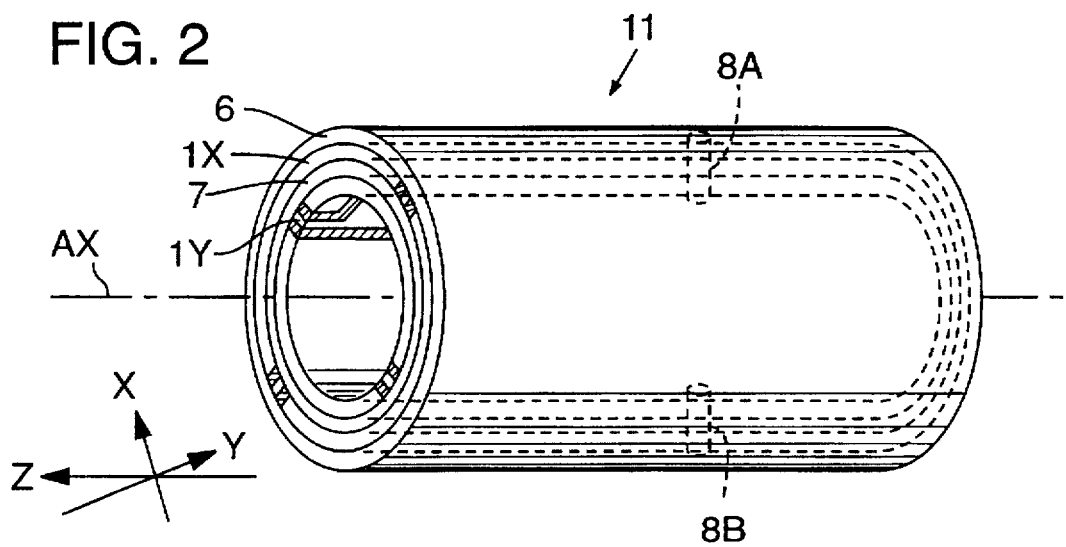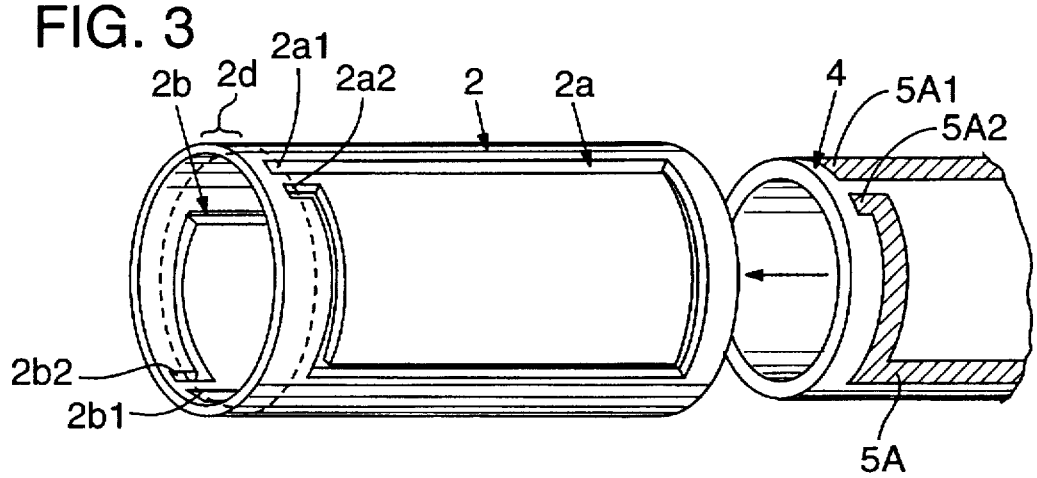

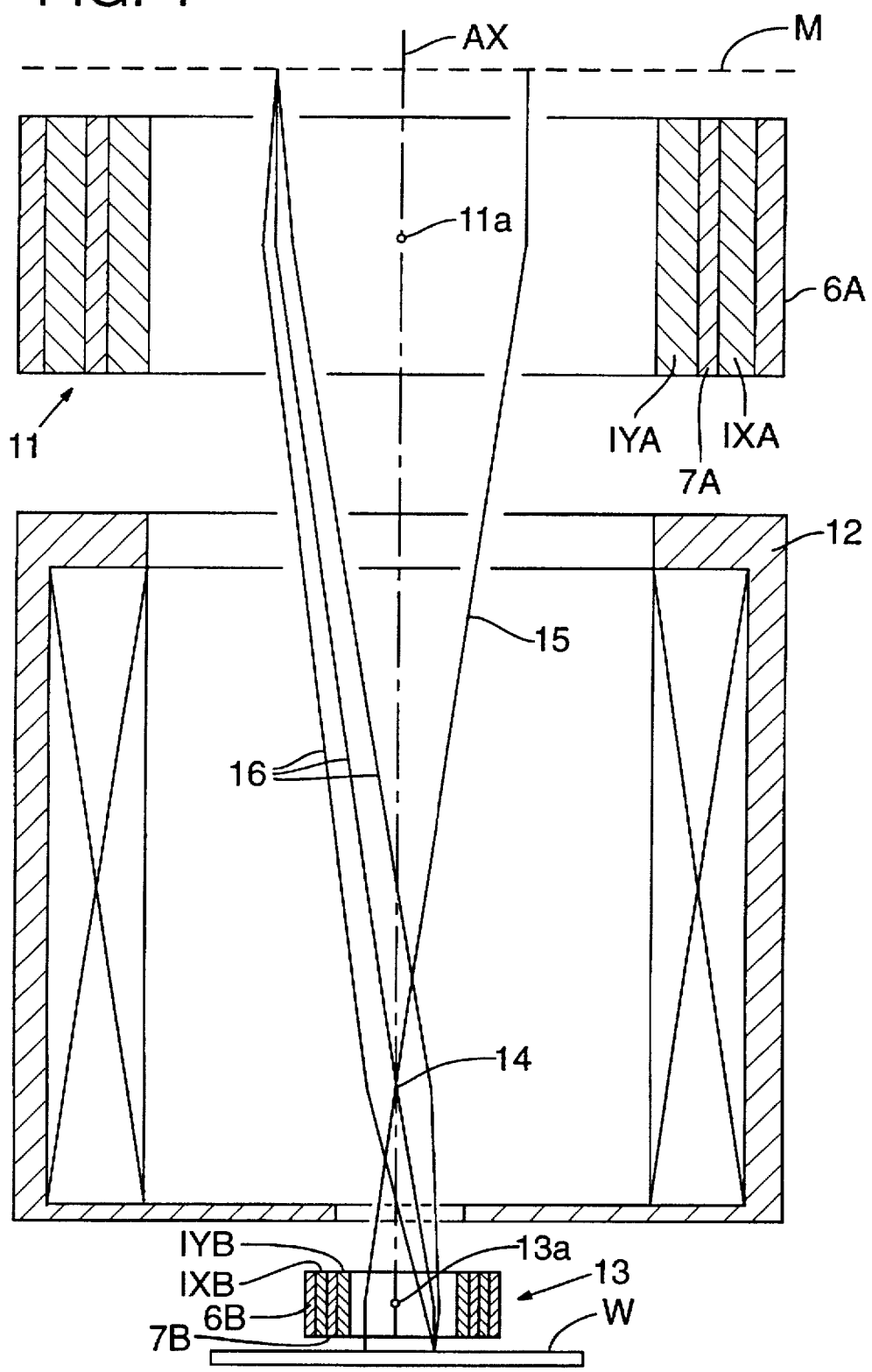

ELECTROMAGNETIC DEFLECTOR

FIELD OF THE INVENTION

This invention pertains to electromagnetic deflectors used to deflect a charged particle beam, e.g., an electron beam or ion beam, or the like.

BACKGROUND OF THE INVENTION

Deflectors are used in various devices for deflecting a beam of charged particles in a desired direction or manner. An example of an apparatus employing deflectors is a scanning electron microscope in which an electron beam must be scanned at high speed and with high precision across the surface of a specimen.

Another example of an apparatus employing deflectors is an electron-beam transfer device used to reductively transfer a mask pattern defining, e.g., a semiconductor integrated circuit, onto the surface of a substrate, e.g., a semiconductor wafer. In such apparatus, a field-selection deflector is used to direct the electron beam onto a single mask subfield, among multiple subfields of a complete mask pattern to be transferred to the substrate. Deflectors are also used in such apparatus to direct the electron beam, after the beam has passed through the mask subfield, to the corresponding transfer subfield on the substrate surface.

Electromagnetic deflectors, used principally to deflect an electron beam using a magnetic field generated by a excitation coil, are primarily used in applications requiring the beam to be deflected with low aberration.

Prior-art excitation coils are formed by winding copper wire usually having a round or nearly square cross-section and having an insulative coating. Normally, deflectors operable to deflect a beam in one dimension include a pair of excitation coils opposing each other across an "optical axis." Such coils are usually disposed inside a cylindrical element made, e.g., from ferrite, thereby forming an electromagnetic deflector. Since it is normally necessary that the electron beam be independently deflectable in two orthogonal dimensions, many prior-art deflectors employ two pairs of coils, each pair being situated perpendicularly to the other pair.

In making prior-art electromagnetic deflectors as described above that include a pair of coils made by winding copper wire, it is difficult to position and attach the pair of coils to a cylindrical outer casing with a degree of accuracy demanded by modern applications. As a result, whenever the coils are energized with electric current, they frequently exhibit an unacceptable degree of deflection aberration (deflection distortion).

Prior-art electromagnetic deflectors intended for use in deflecting an electron beam in two perpendicular directions also frequently exhibit problems due to the difficulty in arranging the two pairs of coils precisely perpendicular to each other inside the outer casing. Representative problems with such deflectors include a tendency for the beam to not be deflected accurately in the desired direction(s).

SUMMARY OF THE INVENTION

The present invention solves the problems, discussed above, in prior-art deflectors. A first object of the present invention is to provide an electromagnetic deflector in which the excitation coils are arranged with a high degree of precision relative to each other.

A second object of the present invention is to provide an electromagnetic deflector operable to deflect a charged particle beam in at least two dimensions, in which deflector the coils are arranged so that they intersect at a desired angle with a high degree of precision and which can accurately deflect a charged particle beam, such as an electron beam, in the desired directions.

According to a preferred embodiment, an electromagnetic deflector according to the present invention comprises a hollow cylindrical insulator having an optical axis. The cylindrical insulator defines a first loop channel and a second loop channel separate from the first loop channel, and the first and second loop channels oppose each other across the optical axis. An electrically conductive material is embedded in each loop channel to form first and second electrically energizable coils, respectively. Preferably, the electrically conductive material is selected from a group consisting of copper and silver. Also, each of the first and second loop channels has first and second termini that preferably terminate on a first end of the cylindrical insulator. In addition, the cylindrical insulator has a wall thickness, and each loop channel preferably extends through the wall thickness, with the conductive material completely filling the loop channels.

Each loop channel preferably defines one loop with a saddle profile extending θ=120° circumferentially around the cylindrical insulator.

According to another aspect of the present invention, a biaxial electromagnetic deflector is provided. Such a deflector comprises first and second cylindrical insulators concentrically arranged about an optical axis. Each cylindrical insulator defines a first loop channel and a second loop channel separate from the first loop channel, and the first and second loop channels of each cylindrical insulator oppose each other across the optical axis. The first and second loop channels of the first cylindrical insulator are preferably arranged relative to the optical axis at an angle of 90° relative to the first and second loop channels of the second cylindrical insulator to achieve biaxial deflective function. As described above, an electrically conductive material (preferably copper or silver) is embedded in each loop channel to form first and second electrically energizable coils, respectively, in each cylindrical insulator. To concentrically attach the first and second cylindrical insulators together, pins disposed in knock holes defined in the side walls of the first and second cylindrical insulators. Further preferably, an insulating cylinder lacking any coils is concentrically situated between the first and second insulating cylinders. Finally, an outer casing (preferably of a ferromagnetic material such as ferrite) is concentrically placed exteriorly of the first, second, and third insulating cylinders.

According to another aspect of the present invention, methods are provided for making electromagnetic deflectors having improved performance. According to a preferred embodiment of such methods, a first cylindrical body is provided having a wall thickness and an axis, and being made of an electrically insulative material. First and second loop channels are formed in the first cylindrical body, each loop channel extending through the wall thickness and opposing each other across the axis. Each loop channel is filled with an electrically conductive material to form respective electrode coils in the loop channels. Such filling is preferably performed by electroplating, involving the placement of first and second electroplating electrodes on the inner surface of the first cylindrical body in registration with the first and second loop channels, respectively, and performing electroplating to fill each loop channel with an electroplatable metal (e.g., copper or silver). Finally, the first cylindrical body can be placed concentrically inside an outer casing that is preferably ferromagnetic (e.g., ferrite).

To make a biaxial deflector, a second cylindrical body (preferably made of an electrical insulator) is provided having a wall thickness and an axis. The second cylindrical body is dimensioned so as to concentrically slip inside the first cylindrical body. First and second loop channels are formed in the second cylindrical body, each loop channel extending through the wall thickness and opposing each other across the axis. Each loop channel is filled with an electrically conductive material (preferably copper or silver) to form respective electrode coils in the loop channels. The second cylindrical body is slipped concentrically inside the first cylindrical body, preferably with an insulative cylinder therebetween, and preferably with the electrode coils of the first cylindrical body being arranged at an angle of 90° relative to the electrode coils of the second cylindrical body. This entire assembly can be slipped inside an outer ferromagnetic (preferably ferrite) casing.

Electromagnetic deflectors according to this invention comprises electrode coils that are positioned relative to each other with a degree of precision that is several orders of magnitude greater than in prior-art deflectors. Consequently, any deflection aberration that originates in deflectors according to this invention is reduced by several orders of magnitude compared to similar aberrations arising in prior-art deflectors with wound coils.

The foregoing and additional features and advantages of the present invention will be more readily apparent from the following detailed description, which proceeds with reference to the accompanying drawings.

BRIEF DESCRIPTION OF THE DRAWINGS

FIG. 1 is an oblique-view drawing showing an example embodiment of an X-direction deflecting coil of an electromagnetic deflector according to the present invention.

FIG. 2 is an oblique-view drawing showing an example embodiment of a bi-axial (X–Y) electromagnetic deflector according to the present invention.

FIG. 3 is an oblique-view drawing showing how the FIG. 1 embodiment can be manufactured.

FIG. 4 is a sectional drawing of a portion of a reducing electron-beam transfer device employing the electromagnetic deflector as shown in FIG. 2.

DETAILED DESCRIPTION

The invention will be described by reference to the following example embodiments, which are intended to merely illustrate the best mode now known for practicing the invention. The scope of the invention is not to be considered limited thereto.

A preferred embodiment, representing the current best mode, of a biaxial electromagnetic deflector 1 according to the present invention is shown in FIG. 2. The FIG. -2 embodiment is operable to independently deflect a charged particle beam (e.g., an electron beam) in two perpendicular dimensions, X and Y as the beam propagates generally in the Z dimension through the deflector 1. Deflection in the X dimension is achieved by the X-dimension deflector 1X, and deflection in the Y dimension is achieved by the Y-dimension deflector 1Y. Both deflectors 1X, 1Y are concentrically arranged relative to an axis AX.

The X-dimension deflector 1X is shown in FIG. 1. A set of coils 3A, 3B for deflecting the beam in various directions in the X dimension is shown. A cylinder 2, made from an insulating material (e.g., a ceramic or a synthetic resin such as polyimide, etc.), is used to provide support for the coils 3A, 3B. The cylinder 2 is fabricated with highly concentric inside and outside diameters relative to the axis AX of the cylinder. Such concentricity allows the X-dimension deflector 1X to be snugly slipped axially inside a cylindrical outer casing, as discussed below.

The coils 3A, 3B, are preferably made, by way of example, from copper. Each coil defines a loop shape that is embedded in the wall of the insulating cylinder 2. Thus, each coil 3A, 3B has a saddle profile wrapping an angle θ, defined at the axis AX of the cylinder 2, about the circumference of the cylinder 2. By way of example, the angle θ is preferably 120°. Each coil 3A, 3B has two termini 3A1, 3A2, 3B1, 3B2, respectively, preferably located on one end of the cylinder 2. Lead wires (not shown) can be connected to each terminus to supply an excitation electric current to the corresponding electrodes.

The cylinder 2 defines diametrically opposing knock holes (only one of which knock holes 2c appears in FIG. 1). Each knock hole can have a slot-shaped profile extending part way around the circumference of the cylinder 2. The purpose of the knock holes is discussed below.

The X-dimension deflector 1X of FIG. 1 can be manufactured by a process as partially depicted in FIG. 3. The cylinder 2 is fabricated from an insulator material and has an outside diameter and inside diameter according to design specifications. An opposing pair of loop-shaped channels 2a, 2b is cut or otherwise formed in the sides of the cylinder 2, preferably having a depth extending through the thickness dimension of the sides. The channels 2a, 2b and the knock holes (not shown in FIG. 3) can be formed with an extremely high degree of precision by, for example, a machining operation.

If the cylinder 2 is formed from an electrically insulative photosensitive resin, such as a polyimide, the channels 2a, 2b and knock holes 2c can be formed by a photolithographic process. In such a process, a mask defining the desired pattern of the channels 2a, 2b and of the knock holes 2c relative to the channels is applied to the perimeter of the cylinder 2. The cylinder 2 is then exposed to parallel ultraviolet light, or the like, and then developed, thereby forming the channels 2a, 2b and knock holes 2c.

Next, a cylinder 4 made of a metal such as aluminum is fabricated to have an outside diameter allowing the cylinder 4 to slip-fit inside the cylinder 2. Electrodes 5A, 5B of electrically conductive film are formed on or adhered to the sides of the cylinder 4 in positions corresponding to the positions of the channels 2a, 2b in the cylinder 2 but slightly wider than the channels 2a, 2b. (Only one of the electrodes 5A appears in FIG. 3, the other electrode 5B is understood to be on the opposing side of the cylinder 4.) Lead wires (not shown) are connected to the termini 5A1, 5A2, 5B1, 5B2 of the electrodes. The electrodes 5A, 5B can be made by chemical plating or sputtering, for example.

The cylinder 4 is then slip-fit into the cylinder 2 such that the electrodes 5A, 5B are registered precisely with the respective channels 2a, 2b. The resulting assembly is placed in a plating vat for, e.g., copper plating. To commence electroplating, an electrical current is applied between the electrodes 5A, 5B and, for copper plating, a separate copper plate also immersed in the plating vat. Electroplating is continued until the resulting layer of metal on the cylinder 2 fills the channels 2a, 2b and extends sufficiently beyond the outside diameter of the cylinder 2. The assembly of cylinder 2 and cylinder 4 is removed from the plating vat, and any electro-deposited metal overflowing the channels 2a, 2b is removed by, e.g., machining, to form the coils 3A, 3B (FIG. 1) that are flush with the outside diameter of the cylinder 2 and completely fill the channels 2a, 2b. Afterward, as shown in FIG. 3, the end portion 2d overlapping the termini 2a1, 2a2, 2b1, 2b2 of the channels 2a, 2b, respectively, at the end of the cylinder 2 is removed.

The assembly of cylinder 2 and cylinder 4 is then immersed for a long period of time in a suitable acid (such as phosphoric acid for dissolving aluminum) to dissolve the cylinder 4. Thus, an X-dimension deflector 1X as shown in FIG. 1 is manufactured. Lead wires, not shown, are connected to the termini 3A1, 3A2, 3B1, 3B2 of the coils 3A, 3B, respectively.

Electroplating as described above is preferred because the electrodes 3A, 3B are thus easily embedded in the channels 2a, 2b in the cylinder 2. In addition, since the end portion 2d is removed after the electroplating step, the portion 2e of the cylinder 2 that is surrounded by the coil 3A (and a similar portion surrounded by the coil 3B) will not fall out during fabrication.

To continue with a preferred process for making a bi-axial deflector, a Y-dimension deflector 1Y (see FIG. 2) for deflecting the charged particle beam in various directions in the Y dimension is formed in the same way as the X-dimension deflector 1X described above. The Y-dimension deflector 1Y has the same structure as the X-dimension deflector 1X, but the Y-dimension deflector 1Y is fabricated to have an outside diameter that is smaller than the inside diameter of the X-dimension deflector 1X by a desired amount. In addition, an opposing pair of round knock holes (not shown) are formed in the side of the Y-dimension deflector 1Y at locations that are displaced 90° from the knock holes 2c in the X-dimension deflector 1X.

A cylindrical casing 6 of a material such as ferrite, having an inside diameter that will fit snugly over the outside diameter of the X-dimension deflector 1X, and a cylindrical spacer 7 of an electrically insulative material, having an inside diameter that will fit snugly over the inside diameter of the X-dimension deflector 1X and the outside diameter of the Y-dimension deflector 1Y, are prepared. An opposing pair of elongated knock holes are also formed in the sides of the spacer 7. The Y-dimension deflector 1Y is fitted axially inside the X-dimension deflector 1X by means of the spacer 7 such that the knock holes of each are aligned with each other. Cylindrical pins 8A, 8B, made from an electrically insulative material, are driven into the respective sets of aligned knock holes in the X-dimension deflector 1X, the spacer 7, and the Y-dimension deflector 1Y. The rotational angle between the two deflectors 1X, 1Y is adjusted so that the coils 3A, 3B in the X-dimension deflector 1X are disposed precisely at 90° relative to the corresponding coils in the Y-dimension deflector 1Y. The knock holes 2c in the X-dimension deflector 1X are slot-shaped to permit such an adjustment.

Of course, if the X-dimension deflector 1X and the Y-dimension deflector 1Y can be individually manufactured with high precision, the knock holes 2c in the X-dimension deflector 1X could be made round instead of slotted, and the two deflectors 1X, 1Y could be disposed, during assembly, exactly 90° relative to each other simply by driving in the pins 8A, 8B.

The assembly described above comprising the X-dimension deflector 1X and the Y-dimension deflector 1Y is then fitted to the inner surface of an outer casing 6 to complete assembly of a bi-axial electromagnetic deflector that can independently deflect a charged particle beam in two perpendicular directions. An electromagnetic deflector as described above having an X-dimension deflector 1X in which the coils 3A, 3B have a saddle profile fitted into the interior of an outer casing 6 is one type of a so-called cored saddle-type deflector.

The outer casing 6 is preferably strongly magnetic. Thus, whenever current is passed through the coils (e.g., 3A, 3B), the assembly becomes operable as an electromagnetic deflector for deflecting a charged particle beam in a desired direction(s) in two dimensions. The relative angle between the coils of the X- and Y-dimension deflectors can be adjusted simply by rotating the coils relative to each other about the axis, thereby enabling the relative angle between the multiple coils to be set to a target value with a high degree of precision. Consequently, a biaxial deflector is produced that can accurately deflect a charged particle beam in intended directions.

In the foregoing, since the X-dimension deflector 1X and the Y-dimension deflector 1Y both comprise one-turn coils, it may be necessary to increase the current in order to achieve a large ampere-turn value. In cases where the electrical current value needs to be decreased due to, e.g., circumstances such as the drive power source, several layers of similar loop-shaped coils can be layered concentrically within, by way of example, the X-dimension deflector 1X, with the loop-shaped coils being externally connected in series and a current supplied to energize the coils.

FIG. 4 depicts an example embodiment of an electron-beam reductive transfer device in which biaxial deflectors of the type shown in FIG. 2 are employed. The pattern defined on a mask M is divided into multiple subfields at a desired pitch in two perpendicular directions (these shall be the X direction and the Y direction extending in a plane perpendicular to the plane of the page). An electron beam 16 impinges on a mask subfield from an illumination system (not illustrated). The electron beam 16, having passed through a mask subfield, is deflected by an upper-stage bi-axial electromagnetic deflector 11 according to the present invention, and focused by an electromagnetic projection lens 12. The electron beam is then deflected by a lower-stage electromagnetic deflector 13 according to the present invention and focused on a corresponding transfer subfield on a wafer W to which an electron-beam resist has been applied. Thus, the pattern in one of the mask subfields is reduced by a demagnification factor β (β is, e.g., ¼), inverted, and transferred onto the corresponding transfer subfield on the wafer.

A crossover 14, which is effectively the image of the electron-beam source, is situated on the optical axis AX near the lower end of the projection lens 12.

When transferring the pattern in a mask subfield located at a position on the mask M that is symmetric about the optical axis AX to the wafer W, the electron beam (shown by the principal ray 15) that has passed through that subfield is deflected by the electromagnetic deflectors 11, 13 so that the beam is symmetric with the electron beam 16.

In this example, each of the bi-axial electromagnetic deflectors 11 and 13 is constructed similarly to the bi-axial electromagnetic deflector of FIG. 2. Namely, the upper-stage electromagnetic deflector 11 comprises, in order from outside to inside, an X-dimension deflector 1XA similar to the X-dimension deflector 1X in FIG. 1, a cylindrical spacer 7A (electrically insulating), and a Y-dimension deflector 1YA, all fitted inside a cylindrical casing 6A made from an insulator. The lower-stage electromagnetic deflector 13 comprises, in order from outside to inside, an X-dimension deflector 1XB similar to the X-dimension deflector 1X in FIG. 1, a cylindrical spacer 7B, and a Y-dimension deflector 1YB, all fitted inside a cylindrical casing 6A. In addition, in each deflector 11, 13, the coils 1XA, 1XB are angularly arranged perpendicularly to the coils 1YA, 1YB, respectively. Furthermore, the coils 1XA, 1XB are oriented at the same angle.

Furthermore, since the demagnification from the mask M to the wafer W is β, the shape (inside diameter and height, etc.) of the electromagnetic deflector 13 on the wafer side is an analog of the shape of the electromagnetic deflector 11 on the mask side, at a dimensional ratio of β. In addition, the distance from the crossover 14 to the center 13a of the wafer-side electromagnetic deflector 13 is less by a factor of β than the distance from the crossover 14 to the center 11a of the mask-side electromagnetic deflector 11. For example, if the demagnification factor β is ¼, then each of the dimensions of the wafer-side electromagnetic deflector 13 (being an analog of the mask-side electromagnetic deflector 11) is ¼ the corresponding dimension of the mask-side electromagnetic deflector 11. Similarly, and the distance from the crossover 14 to the center 13a of the wafer-side electromagnetic deflector 13 is ¼ the distance from the crossover 14 to the center 11a of the mask-side electromagnetic deflector 11.

As a result, the path of an electron beam 16 as it passes through each of the electromagnetic deflectors 11 and 13 is analogous, and the similarities between the deflecting magnetic fields and electron beam paths are maintained along the entire electron beam path. Thus, any residual deflection aberration in the upper-stage electromagnetic deflector 11 (aberration which remains even though the deflector is manufactured according to design specifications) and any residual deflection aberration in the lower-stage electromagnetic deflector 13 cancel each other out. This is advantageous because it minimizes any distortion of the pattern being transferred onto the wafer W. (The residual aberration in the electromagnetic deflectors 11, 13 is the aberration which is unique to the corresponding electromagnetic deflector. Such aberrations originate, e.g., in differences in the magnetic field at the center versus at the perimeter of the deflector.)

Even though the embodiments of an electromagnetic deflector as described above are described in connection with an electron-beam reducing transfer device, it will be understood that electromagnetic deflectors according to this invention can similarly be utilized in other apparatus employing a scanned beam of charged particles such as scanning electron microscopes.

Since channels that can be formed in the sides of a cylindrical insulator can be positioned with a high degree of precision by machining or the like or by photolithographic processing, an electromagnetic deflector according to this invention comprises electrode coils that are positioned relative to each other with a degree of precision that is several orders of magnitude greater than in prior-art deflectors. Consequently, any deflection aberration that originates in deflectors according to this invention is reduced by several orders of magnitude compared to similar aberrations arising in prior-art deflectors with wound coils.

Because pins are preferably used to fix the relative angular orientations of the multiple cylindrical insulators comprising deflectors according to the present invention, there is the benefit of being able to easily and accurately fix the relative angles of multiple deflector coils at a target angle.

In addition, when the conductors filling the loop-shaped channels in the sides of the cylindrical insulator is a metal selected from a group consisting of copper and silver, there is the advantage of being able to easily embed the metal in the channels by, e.g., electroplating. Furthermore, if the conductors are copper, electroplating can be easily and inexpensively accomplished. If silver is used as the conductor, the size of the coil can be reduced due to the especially good electrical conductivity of silver. Thus, silver conductors are preferred for applications requiring small and high-precision electromagnetic deflectors.

Whereas the invention has been described in connection with preferred embodiments, it will be understood that it is not limited to those embodiments. On the contrary, the invention is intended to encompass all alternatives, modifications, and equivalents as may be included within the spirit and scope of the invention as defined by the appended claims.

What is claimed is:

1. An electromagnetic deflector, comprising:
   (a) a hollow cylindrical insulator having an optical axis, the cylindrical insulator defining a first loop channel and a second loop channel separated from the first loop channel, the first and second loop channels opposing each other across the optical axis; and
   (b) an electrically conductive material embedded in each loop channel to form first and second electrically energizable coils.

2. The electromagnetic deflector of claim 1, wherein the electrically conductive material is selected from a group consisting of copper and silver.

3. The electromagnetic deflector of claim 1, wherein the cylindrical insulator has first and second ends, and each of the first and second loop channels has first and second termini, wherein the termini of both loop channels are situated on the first end of the cylindrical insulator.

4. The electromagnetic deflector of claim 3, wherein each loop channel defines one loop.

5. The electromagnetic deflector of claim 4, wherein the cylindrical insulator has a wall thickness, each loop channel extends through the wall thickness, and the conductive material completely fills the loop channels.

6. The electromagnetic deflector of claim 4, wherein each loop channel has a saddle profile extending at an angle θ=120° circumferentially around the cylindrical insulator.

7. A biaxial electromagnetic deflector, comprising:
   (a) first and second hollow cylindrical insulators concentrically arranged about an optical axis;
   (b) each cylindrical insulator defining a first loop channel and a second loop channel separated from the first loop channel, the first and second loop channels of each cylindrical insulator opposing each other across the optical axis;
   (c) the first and second loop channels of the first cylindrical insulator being arranged relative to the optical axis at an angle of 90° relative to the first and second loop channels of the second cylindrical insulator; and
   (d) an electrically conductive material embedded in each loop channel to form first and second electrically energizable coils in each cylindrical insulator.

8. The electromagnetic deflector of claim 7, wherein the first and second cylindrical insulators are concentrically attached to each other by pins disposed in knock holes defined in side walls of the first and second cylindrical insulators.

9. The electromagnetic deflector of claim 7, further comprising a third hollow cylindrical insulator concentrically situated between the first and second hollow cylindrical insulators.

10. The electromagnetic deflector of claim 9, further comprising an outer casing concentrically situated exteriorly of the first, second, and third hollow cylindrical insulators.

11. The electromagnetic deflector of claim 10, wherein the outer casing is ferromagnetic.

12. The electromagnetic deflector of claim 11, wherein the outer casing is ferrite.

13. The electromagnetic deflector of claim 7, wherein the electrically conductive material is selected from a group consisting of copper and silver.

* * * * *